United States Patent
Tomita et al.

(10) Patent No.: US 7,781,233 B2
(45) Date of Patent: Aug. 24, 2010

(54) METHOD OF MANUFACTURING SEMICONDUCTOR DEVICE

(75) Inventors: Ryuji Tomita, Kanagawa (JP); Yosuke Sugiyama, Sagamihara (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/429,467

(22) Filed: Apr. 24, 2009

(65) Prior Publication Data

US 2009/0269863 A1 Oct. 29, 2009

(30) Foreign Application Priority Data

Apr. 24, 2008 (JP) .............................. 2008-113521

(51) Int. Cl.
*H01L 21/00* (2006.01)
(52) U.S. Cl. .................. 438/7; 438/5; 438/14; 438/16; 438/592; 257/E21.53
(58) Field of Classification Search .................. 438/5, 438/7, 14, 16, 592; 257/E21.53
See application file for complete search history.

(56) References Cited

U.S. PATENT DOCUMENTS

2009/0098665 A1 * 4/2009 Bu et al. ..................... 438/7

FOREIGN PATENT DOCUMENTS

| JP | 07-235574 | 9/1995 |
|---|---|---|
| JP | 10-256191 | 9/1998 |
| JP | 2005-020032 | 1/2005 |

* cited by examiner

*Primary Examiner*—Jack Chen
(74) *Attorney, Agent, or Firm*—Young & Thompson (57) ABSTRACT

In a semiconductor manufacturing method, a metal film is formed on a substrate and heat treated. The relationship between substrate warping and the heat treatment temperature during silicide formation is acquired (S1). A silicide film is formed by forming a metal film on a substrate and heat treating, including substrate measurement during heat treatment (S2). The relationship between substrate warping at heat treatment temperature is determined from the relationship between the warping of the substrate and the temperature for heat treatment and the temperature for heat treatment carried out on the substrate when the warping of the substrate is measured. The difference between found warping and the measured warping is calculated (S4). Whether the difference exceeds a predetermined value is determined (S5). If the difference exceeds a predetermined value, heat treatment conditions are adjusted (S8), but they not adjusted if the difference is no greater than the predetermined value.

6 Claims, 6 Drawing Sheets

METHOD OF MANUFACTURING SEMICONDUCTOR DEVICE

This application is based on Japanese patent application NO. 2008-113521, the content of which is incorporated hereinto by reference.

BACKGROUND

1. Technical Field

The present invention relates to a method of manufacturing a semiconductor device.

2. Related Art

Conventionally, a technology of forming a silicide film on a substrate in a process for manufacturing a semiconductor device is known. Reduction in the resistance of the gate and the source/drain electrodes can be achieved by forming a silicide film.

Conventionally, in order to form silicide films, a metal film is formed on a substrate and heat treatment is carried out so that the silicon on the surface of the substrate and the metal film react (for example, Japanese Laid-open patent publication NO. 10-256191).

When the heat treatment is carried out, the temperature of the heat treatment unit is set to a predetermined temperature, and thus a reaction of conversion to silicide progresses.

SUMMARY

However, there is a problem with conventional methods for heat treatment in that it is difficult to obtain a silicide film having a desired film quality.

As a result of examination by the present inventor, it was found that the degree of progress in the reaction of conversion to silicide at a certain temperature for heat treatment differs depending on the substrate or the type of product. It is assumed that a slight difference in the amount of p type or n type impurities injected into the substrate and the difference in the state of oxidation on the surface of the substrate affect the degree of progress in the reaction of conversion to silicide.

Therefore, a desired silicide film is not formed depending on the substrate even when the temperature of the heat treatment unit is set to a predetermined temperature for heat treatment.

In addition, it may also be possible to carry out heat treatment while monitoring the temperature of the substrate during heat treatment. As described above, however, a slight difference in the amount of impurities and the difference in the state of oxidation on the surface of the substrate affect the degree of progress in the reaction of conversion to silicide, and therefore a desired silicide film is not formed depending on the substrate even when the temperature of the substrate is measured and the heat treatment unit is controlled so that the temperature for heat treatment follows the preset profile.

The present invention is provided to solve the problems.

In one embodiment, there is provided a method of manufacturing a semiconductor device, the method including: acquiring in advance the relationship between the warping of a substrate having a layer including silicon at a surface and the temperature for heat treatment when the silicide film is formed on the substrate by forming a metal film on the substrate and carrying out heat treatment; and forming a silicide film on a substrate having a layer including silicon on a surface, wherein the forming a silicide film includes: forming a metal film on the substrate; and forming the silicide film through heat treatment where the temperature of the substrate on which the metal film is formed is increased so that the metal film and the silicon at the surface of the substrate react, and the forming a silicide film includes: measuring the warping of the substrate during heat treatment; finding the warping of the substrate corresponding to the temperature for heat treatment carried out on the substrate when the warping of the substrate is measured from the relationship between the warping of the substrate and the temperature for heat treatment; calculating the difference between the found warping of the substrate and the measured warping of the substrate; determining whether the difference exceeds a predetermined value; stopping the heat treatment when the difference exceeds the predetermined value, or finding an expected value of the temperature of the substrate corresponding to the measured warping of the substrate from the relationship between the warping of the substrate and the temperature for heat treatment; comparing the temperature for heat treatment carried out on the substrate when the warping of the substrate is measured and the expected value of the temperature of the substrate so that it is determined which of these temperatures is higher or lower; adjusting the conditions for heat treatment carried out on the substrate during heat treatment based on the results of the determination and the difference; and not adjusting the conditions for heat treatment carried out on the substrate during heat treatment when the difference is a predetermined value or less.

When a silicide film is formed on a substrate, the substrate warps in accordance with the progress of the reaction of conversion to silicide. For example, when a substrate on which a metal film is formed starts being heated, metal atoms diffuse into the substrate, and thus the substrate receives contracting stress.

When the substrate is further heated, the diffused metal atoms combine with silicon in the substrate so that crystals grow, and at this time the substrate receives compressing stress.

Thus, the substrate warps to a certain extent in accordance with the progress of the reaction of conversion to silicide.

The present invention is achieved by focusing on this point.

According to the present invention, the relationship between the warping of the substrate and the temperature for heat treatment when a silicide film is formed on a substrate is acquired in advance. After that, the warping of the substrate is measured during the heat treatment for conversion to silicide. Thus, the warping of the substrate at the temperature for heat treatment carried out on the substrate is found from the temperature for heat treatment carried out on the substrate and the relationship between the warping of the substrate and the temperature for heat treatment, and the difference between the found warping of the substrate and the measured warping of the substrate is found.

When this difference exceeds a predetermined value, it can be determined that the reaction of conversion to silicide has progressed excessively, or the progress of the reaction of conversion to silicide is too slow. In addition, the conditions for heat treatment are adjusted so that the degree of progress of the reaction of conversion to silicide can be adjusted, and a silicide film having a desired film quality can be obtained.

Furthermore, when the difference between the found warping of the substrate and the measured warping of the substrate exceeds a predetermined value, the heat treatment may be stopped and the substrate may be discarded Thus, a semiconductor device having a silicide film of which the film quality is not desirable can be prevented from being manufactured.

In another embodiment, there is provided a method of manufacturing a semiconductor device, the method including: acquiring the relationship between the warping of a substrate having a layer including silicon at a surface and the temperature for heat treatment when the silicide film is formed on the substrate by forming a metal film on the substrate and carrying out heat treatment; and forming a silicide film on a substrate having a layer including silicon at a surface, wherein the forming a silicide film includes: forming a metal film on the substrate; forming the silicide film through heat treatment where the temperature of the substrate on which the metal film is formed is increased so that the metal film and the silicon at the surface of the substrate react, and the forming a silicide film includes: measuring the warping of the substrate during heat treatment; finding an expected value of the temperature of the substrate corresponding to the measured warping of the substrate from the relationship between the warping of the substrate and the temperature for heat treatment; finding the difference between the expected value of the temperature of the substrate and the temperature for heat treatment carried out on the substrate when the warping of the substrate is measured; determining whether the difference exceeds a predetermined value; stopping the heat treatment when the difference exceeds the predetermined value, or comparing the temperature for heat treatment carried out on the substrate when the warping of the substrate is measured and the expected value of the temperature of the substrate so that it is determined which of these temperatures is higher or lower; adjusting the conditions for heat treatment carried out on the substrate during heat treatment based on the results of the determination and the difference; and not adjusting the conditions for heat treatment carried out on the substrate during heat treatment when the difference is a predetermined value or less.

According to the present invention, the relationship between the warping of the substrate and the temperature for heat treatment when a silicide film is formed on a substrate is acquired in advance. After that, the warping of the substrate is measured during the heat treatment for conversion to silicide.

Thus, an expected value of the temperature of the substrate is found from the relationship between the warping of the substrate and the temperature for heat treatment and the measured warping of the substrate, and the difference between the expected value of the temperature of the substrate and the temperature for heat treatment carried out on the substrate when the warping of the substrate is measured is found.

When this difference exceeds a predetermined value, it can be determined that the reaction of conversion to silicide has progressed excessively, or the progress of the reaction of conversion to silicide is too slow. Therefore, the conditions for heat treatment are adjusted so that the degree of progress of the reaction of conversion to silicide can be adjusted, and a silicide film having a desired film quality can be obtained.

Furthermore, when the difference exceeds a predetermined value, the heat treatment may be stopped and the substrate may be discarded. Thus, a semiconductor device having a silicide film of which the film quality is not desirable can be prevented from being manufactured.

According to the present invention, there is provided a method of manufacturing a semiconductor device with which a semiconductor device having a silicide film with a desired film quality can be surely obtained.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the following, the embodiments of the present invention are described in reference to the drawings. Here, for all of the drawings, the same symbols are attached to the same components, and the descriptions thereof are not repeated.

First Embodiment

Figure 3:
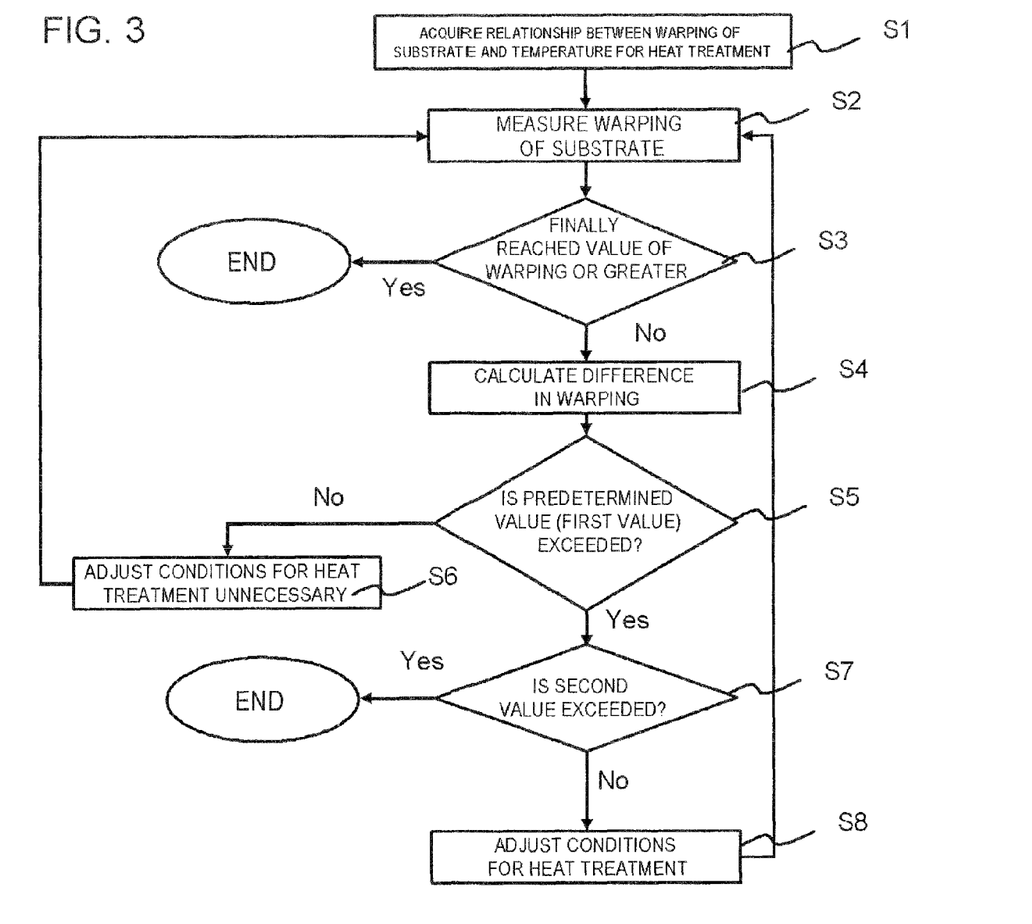
FIG. 3 is a flow chart showing the process for manufacturing a semiconductor device according to the first embodiment.

First, a method of manufacturing a semiconductor device according to the present embodiment is outlined in reference to FIG. 3.

The method of manufacturing a semiconductor device according to the present invention includes: acquiring the relationship between the warping of a substrate 11 having a layer including silicon at a surface and the temperature for heat treatment when a silicide film 13 is formed on the substrate 11 by forming a metal film 12 on the substrate 11 and carrying out heat treatment (process S1); and forming a metal film 12 on the substrate 11 having the layer including silicon at the surface; and forming a silicide film 13 through heat treatment, during which the temperature of the substrate 11 on which the metal film 12 is formed is raised so that the metal film 12 and the silicon at the surface of the substrate 11 react (second step).

The forming the silicide film 13 includes: measuring the warping of the substrate 11 during heat treatment (process S2); finding the warping of the substrate 11 corresponding to the temperature for heat treatment carried out on the substrate 11 when the warping of the substrate 11 is measured from the relationship between the warping of the substrate 11 and the temperature for heat treatment; calculating the difference between the found warping of the substrate 11 and the measured warping of the substrate 11 (process S4); determining whether the difference exceeds a predetermined value (process S5); and stopping the heat treatment when the difference exceeds the predetermined value, or finding an expected value of the temperature of the substrate 11 corresponding to the measured warping of the substrate 11 from the relationship between the warping of the substrate 11 and the temperature for heat treatment; comparing the temperature for heat treatment carried out on the substrate 11 when the warping of the substrate 11 is measured and the expected value of the temperature of the substrate 11 so that it is determined which of these temperatures is higher or lower; and adjusting the conditions for heat treatment carried out on the substrate 11 during heat treatment based on the results of the determination and the difference (process S8); and not adjusting the conditions for heat treatment carried out on the substrate 11 during heat treatment when the difference is a predetermined value or less (process S6).

Next, the method of manufacturing a semiconductor device according to the present embodiment is described in detail.

(Preparatory Step (First Step))

Figure 1A:
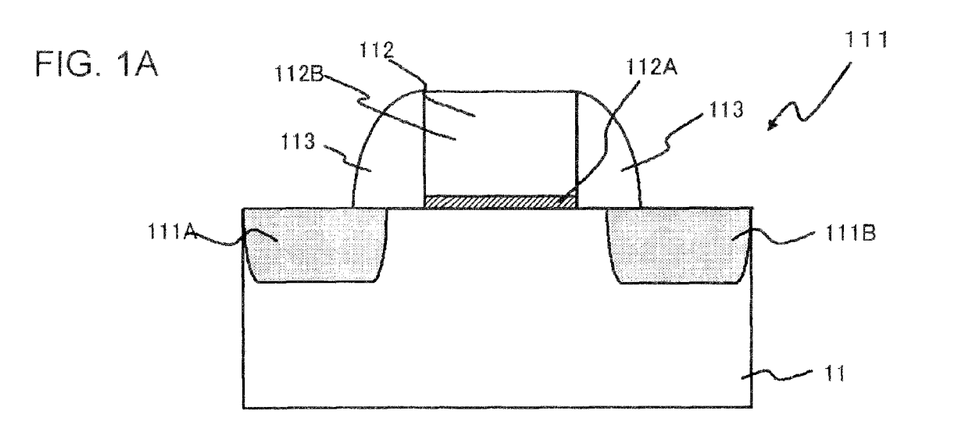
FIGS. 1A and 1B are diagrams showing a semiconductor device during the manufacturing process according to a first embodiment of the present invention.

First, as shown in FIG. 1A, the substrate 11 is prepared.

The substrate 11 is a semiconductor substrate, and the substrate 11 is a Si substrate in the present embodiment.

A MOS transistor 111 is formed on this substrate 11.

The MOS transistor 111 has source/drain regions 111A and 111B formed in the surface of the substrate 11, a channel region (not shown) formed between the source/drain regions 111A and 111B, and a gate electrode 112 provided on the channel region.

The gate electrode 112 is provided with a gate insulating film 112A and a polysilicon film 112B formed on the gate insulating film 112A.

Side walls 113 are provided around the gate electrode 112.

An n type impurity or a p type impurity is injected into the source/drain regions 111A and 111B.

Figure 1B:
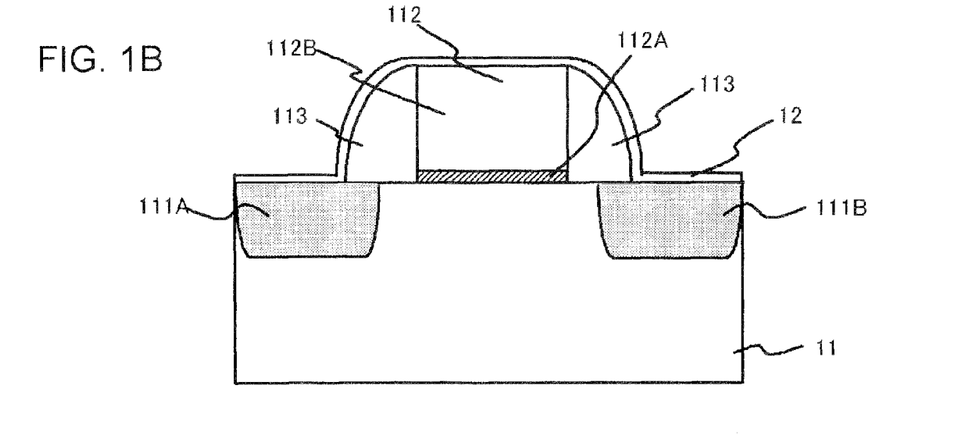

As shown in FIG. 1B, a metal film 12 is formed on the substrate 11.

The substrate 11 is annealed in advance, so that the temperature increases rapidly and spikes, and thus the source/drain regions 111A and 111B are activated. Next, a metal film 12 is formed by a sputtering method. The gate electrode 112, the side walls 113 and the source/drain regions 111A and 111B of the substrate 11 are coated with the metal film 12.

The metal film 12 is a Co film, a Ti film, an Ni film, or the like, and preferably an Ni film.

Next, heat treatment is carried out on the formed metal film 12, and thus the relationship between the warping of the substrate 11 and the temperature for heat treatment when a silicide film 13 is formed on the substrate 11 is acquired (process S1; see FIG. 3).

In the present embodiment, the relationship between the warping of the substrate 11 and the temperature for heat treatment in a first sinter is acquired in advance. Here, the relationship between the warping of the substrate 11 and the temperature for heat treatment is the relationship between the warping of the substrate 11 and the temperature for heat treatment when the silicide film 13 with a desired film quality (see FIG. 2) is obtained Concretely, as shown in FIG. 4, the substrate 11 is heated through lamp annealing with the temperature raised at a predetermined rate (temperature raised at constant rate within range of 15° C./min to 600° C./min; for example 25° C./min) and the warping of the substrate 11 is measured for each temperature.

Figure 4:
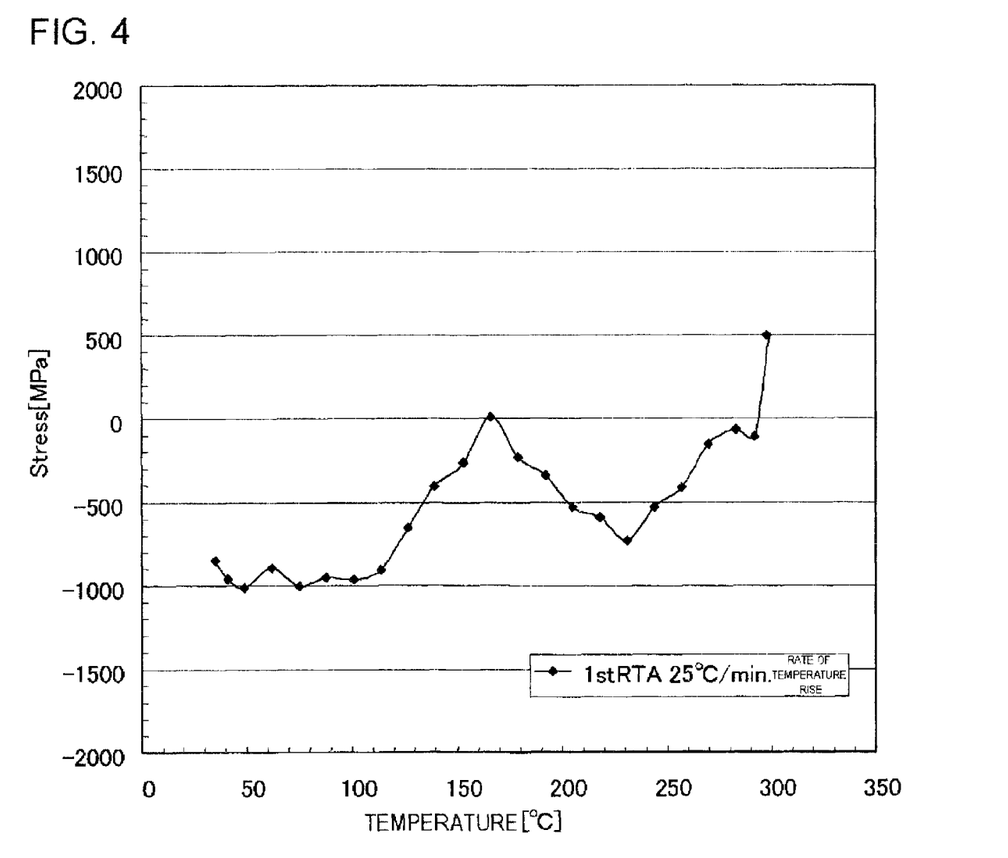
FIG. 4 is a graph showing the relationship between the temperature for heat treatment and warping of the substrate.

The temperature along the lateral axis in FIG. 4 indicates the temperature of the substrate 11 and, concretely, may be the set temperature for the heat treatment unit (for example the temperature inside the heat treatment chamber where heat treatment is carried out, or the temperature of the substrate 11 itself. In the present embodiment, the temperature along the lateral axis in FIG. 4 is the temperature set for the heat treatment unit.

Figure 5:
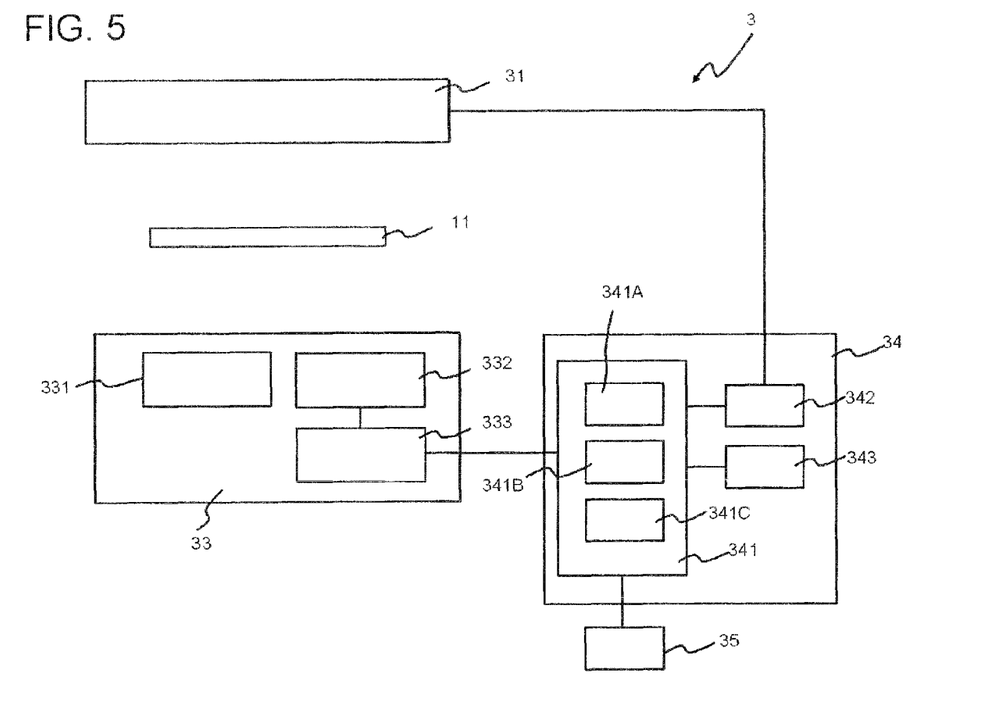
FIG. 5 is a schematic diagram showing a heat treatment unit.

The warping of the substrate 11 can be measured using a heat treatment unit 3, as shown in FIG. 5.

The heat treatment unit 3 has a lamp 31 for heating the substrate 11 and a laser unit 33 provided on the side opposite to the lamp 31 with the substrate 11 therebetween.

The laser unit 33 is provided on the side opposite to the lamp 31 with the substrate 11 therebetween. The laser unit 33 has a laser source 331, a detector 332 and a calculating unit 333.

The substrate 11 is irradiated with a plurality of laser beams from the laser source 331, and light reflected from a plurality of points on the substrate 11 is detected by the detector 332. The calculating unit 333 connected to the detector 332 calculates the distance between the substrate 11 and the laser source 331 from the detected reflected light in order to find the warping of the substrate 11. The found warping of the substrate 11 is output as a numeral value of the stress (MPa).

The relationship between the warping of the substrate 11 and the stress is disclosed Japanese Laid-open patent publication NO. 7-235574, and it is known that the warping of the substrate 11 can be calculated as the numeral value of the stress.

It can be calculated using the following formula, for example.

$$\sigma f = \frac{1}{3}[Es/(1-Vs)][ts/D]^2 [h/tf]$$

Here, σf is the stress, Es is the Young's modulus of the substrate, Vs is the Poisson's ratio, ts is the thickness of the substrate, tf is the thickness of the metal film, D is the diameter of the substrate, and h is the warping of the substrate.

As shown in FIG. 4, the substrate 11 on which the metal film 12 is provided receives contraction stress due to the effects of the metal film 12. In other words, when the surface where the metal film 12 is provided is seen as the top surface, the form of the substrate 11 is such that the center portion protrudes upward as compared to the outer periphery portion. The value of the warping at this time is approximately −1000 MPa, for example.

When the temperature of the substrate 11 rises, metal atoms diffuse into the substrate 11 from the metal film 12 when the temperature for heat treatment is between 100° C. and 180° C. As a result, the substrate 11 receives contraction stress. In other words, when the surface on which the metal film 12 is provided is seen as the top surface, the substrate 11 has such a form that the outer periphery portion protrudes upward as compared to the center portion.

When further heat treatment is carried out, there is new contraction stress during the process through which diffused metal atoms combine with silicon atoms, so that crystals grow. Accordingly, the value of the warping lowers when the temperature for heat treatment is between 180° C. and 230° C. At about 230° C., the metal film becomes a film containing a large amount of $Ni_2Si$.

After that, when further heat treatment is carried out, the state of combination between metal atoms and silicon atoms changes so that the substrate 11 receives contraction stress again.

Accordingly, the value of the warping increases when the temperature for heat treatment is between 230° C. and 300° C.

At about 300° C., the metal film becomes a film containing a large amount of NiSi.

Here, in the step of finding the temperature for heat treatment and the warping of the substrate, the finally reached value of warping of the substrate 11 (finally reached value of warping) is found This finally reached value of warping is the highest value of warping in FIG. 4 (500 MPa, for example).

(Present Manufacturing Process (Second Step))

Next, another substrate 11 different from the substrate 11 used when the relationship between the temperature for heat treatment and the warping of the substrate (FIG. 4) is found is prepared, and a metal film 12 is provided in accordance with the same method as in the preparatory step, and thus a semiconductor device is manufactured.

The substrate 11 used when the relationship between the temperature for heat treatment and the warping of the substrate is found and the substrate 11 used here are of the same type, and a MOS transistor 111 is formed on the substrate, and the concentration and type of impurities in the substrate 11 are the same. Heat treatment is carried out on the substrate 11 on which a metal film 12 is provided, so that a silicide film is formed (first heat treatment, first sinter).

The metal film 12 is formed of the same material as the metal film 12 formed when the relationship between the temperature for heat treatment and the warping of the substrate is found.

In addition, the same conditions for heat treatment are set for the heat treatment unit 3 as those when the relationship between the temperature for heat treatment and the warping of the substrate is found (temperature keeps rising at predetermined rate (temperature rises at constant rate in a range of 15° C./min to 600° C./min; for example 25° C./min)), and the substrate 11 is heated.

Here, the warping of the substrate 11 is measured when the heat treatment unit 3 is at 100° C., for example (process S2; see FIG. 3).

First, it is determined whether the measured value is the finally reached value of warping or higher (process S3).

When the measured value is the finally reached value of warping or higher, the heat treatment is stopped.

When the measured value is less than the finally reached value of the warping, the difference between the measured value of the warping of the substrate 11 and the warping of the substrate at 100° C. as found from the relationship between the temperature for heat treatment and the warping of the substrate (FIG. 4) is found (process S4). Then, it is determined whether the found difference exceeds a predetermined value (first value, for example 200 MPa) (process S5).

When the found difference in the warping is a predetermined value (first value, for example 200 MPa) or less, the reaction of conversion to silicide is progressing at a desired rate, and therefore the conditions for heat treatment are not adjusted (process S6).

When the found difference in the warping exceeds a predetermined value (first value, for example 200 MPa), it is determined whether the difference is a second value (for example 500 MPa) or greater, which is greater than the first value (process S7). When the difference in the warping exceeds the second value, it is determined that the substrate 11 is abnormal, and the heat treatment is stopped.

When the found difference in the warping is the second value or less, the substrate 11 is normal, but the reaction of conversion to silicide has progressed excessively or slow, and therefore the conditions for heat treatment are adjusted (process S8).

Concretely, the conditions for heat treatment are adjusted as follows.

First, an expected value for the temperature of the substrate 11 is found from FIG. 4 (relationship between temperature for heat treatment and warping of substrate) and the measured warping of the substrate 11. Concretely, the temperature corresponding to the measured value of the warping of the substrate 11 (expected value for temperature of substrate 11) is found from the graph showing the relationship between the temperature for heat treatment and the warping of the substrate in FIG. 4.

In addition, when the expected value for the temperature of the substrate 11 is high compared with the temperature for heat treatment carried out on the substrate 11 (here, the temperature set for the heat treatment unit 3) when the warping of the substrate 11 is measured, it can be known that the reaction of conversion to silicide has progressed excessively. In this case, by raising the temperature for heat treatment at a lower rate, the progress of the reaction of conversion to silicide can be made closer to the desired progress (in other words, the progress of the reaction of conversion to silicide when FIG. 4 is prepared). An appropriate amount of the rate at which the temperature rises lowers can be set based on the difference.

When the difference exceeds 250 MPa and is less than 500 MPa, for example, the rate at which the temperature rises in the heat treatment unit 3 is lowered by 5° C. In addition, when the difference is 250 MPa or less and exceeds 200 MPa, the rate at which the temperature rises is lowered by 3° C.

On the other hand, when the expected value for the temperature of the substrate 11 is low compared with the temperature for heat treatment carried out on the substrate 11 (here, the temperature set for the heat treatment unit 3) when the warping of the substrate 11 is measured, it can be known that the reaction of conversion to silicide is too slow. In this case, by raising the temperature for heat treatment at a higher rate, the progress of the reaction of conversion to silicide can be made closer to the desired progress (in other words, the progress of the reaction of conversion to silicide when FIG. 4 is prepared). An appropriate amount of the rate at which the temperature rises can be set based on the difference.

When the difference exceeds 250 MPa and is less than 500 MPa, for example, the rate at which the temperature rises in the heat treatment unit 3 is raised by 5° C. In addition, when the difference is 250 MPa or less and exceeds 200 MPa, the rate at which the temperature rises is raised by 3° C.

Here, when the temperature of the heat treatment unit 3 is 300° C. when the warping of the substrate 11 is measured, the measured value of the warping is less than the finally reached value of the warping, and the difference in the warping of the substrate exceeds the first value, and is the second value or less, the temperature of the heat treatment unit 3 is fixed at 300° C. in the step of adjusting the conditions for heat treatment (process S8), and heat treatment is carried out without raising the temperature until the measured value of the substrate 11 reaches the finally reached value of the warping.

As a result, the actual warping of the substrate 11 can be made the same as the finally reached value of warping.

In addition, it is not necessary for the first value, which is the difference in the warping and becomes the reference for adjusting the conditions for heat treatment, and the second value, which becomes the reference for stopping the heat treatment, to be the same throughout the entire process for heat treatment, and the two may be different. The first value and the second value may be different at initial stage of heat treatment and around the time of completion of heat treatment, for example.

Furthermore, it is preferable for the sequence of steps in the processes S2 to S8 to be carried out a plurality of times in the first sinter.

In particular, when the temperature of the heat treatment unit 3 is at a temperature near the inflexion point of the graph in FIG. 4, it is desirable for the warping of the substrate 11 to be measured for a plurality of temperatures for heat treatment while carrying out the processes S2 to S8. It is preferable to measure the warping of the substrate 11 every time the temperature of the heat treatment unit 3 is at the temperature at the inflexion point in the curve in FIG. 4, as well as at the point 25° C. above and below the inflexion point, for example. By doing so, the tendency of the warping of the substrate 11 (progress in reaction of conversion to silicide) can be understood precisely.

The processes can be carried out in the heat treatment unit 3 shown in FIG. 5.

As described above, this heat treatment unit 3 is provided with the lamp 31, the laser unit 33 (warping measuring unit) and a control apparatus 34.

The control apparatus 34 has a determining unit 341, a control unit 342 and a memory unit 343.

The memory unit 343 stores therein the relationship between the temperature for heat treatment and the warping of the substrate shown in FIG. 4, the maximum value of warping reached and the like.

The determining unit 341 is provided with a first determining unit 341A which acquires the measured value of the warping calculated in the calculating unit 333, and determines whether the measured value of the warping is the maximum value of the warping reached stored in the memory unit 343. When the first determining unit 341A determines in the process S3 that the measured value is the finally reached value of warping or greater, a signal for stopping heating is sent to the lamp 31 from the control unit 342.

On the other hand, when it is determined that the measured value is less than the finally reached value of warping, the second determining unit 341B acquires the temperature for heat treatment when the warping is measured, and finds the value of warping of the substrate at this temperature for heat treatment. Then, the difference with the measured value is detected (process S4).

Here, the temperature for heat treatment when the warping is measured is detected by a temperature sensor 35. Here the temperature detected by the temperature sensor 35 is the temperature set for the heat treatment unit 3, that is to say, the temperature within the heat treatment chamber in the heat treatment unit 3.

The second determining unit 341B carries out the process S5, and when it is determined that the temperature exceeds the first value, the process S7 is carried out. On the other hand, when it is determined that the temperature is the first value or less, no specific process is carried out (process S6).

When the process S7 is carried out by the second determining unit 341B, which determines that the temperature exceeds the second value, a signal for stopping the operation is sent to the lamp 31 from the control unit 342.

On the other hand, when it is determined that the temperature is the second value or less, the temperature for heat treatment as detected by the temperature sensor 35 when the warping is measured and the expected value for the temperature of the substrate as found from the measured value of the warping are compared in the third determining unit 341C, which determines whether the temperature is high or low. The expected value for the temperature of the substrate 11 can be found from the relationship between the temperature for heat treatment and the warping of the substrate stored in the memory unit 343 and the measured value of the warping.

The control unit 342 controls the operation of the lamp 31 based on whether the temperature is high or low according to the determination in the third determining unit 341C and the difference in the warping calculated by the second determining unit 341B. Concretely, the rate of temperature rise for heat treatment is adjusted as described above, or the lamp 31 is driven until the measured value of the warping becomes a predetermined value.

As described above, the first sintering step is carried out, and after that, the part of the metal film 12 that is unreacted and not converted to silicide is removed through wet etching. As a result, the metal film 12 is removed from the side walls 113, and a silicide film 13 remains on the gate electrode 112 and the source/drain regions 111A and 111B (see FIG. 2).

Figure 2:
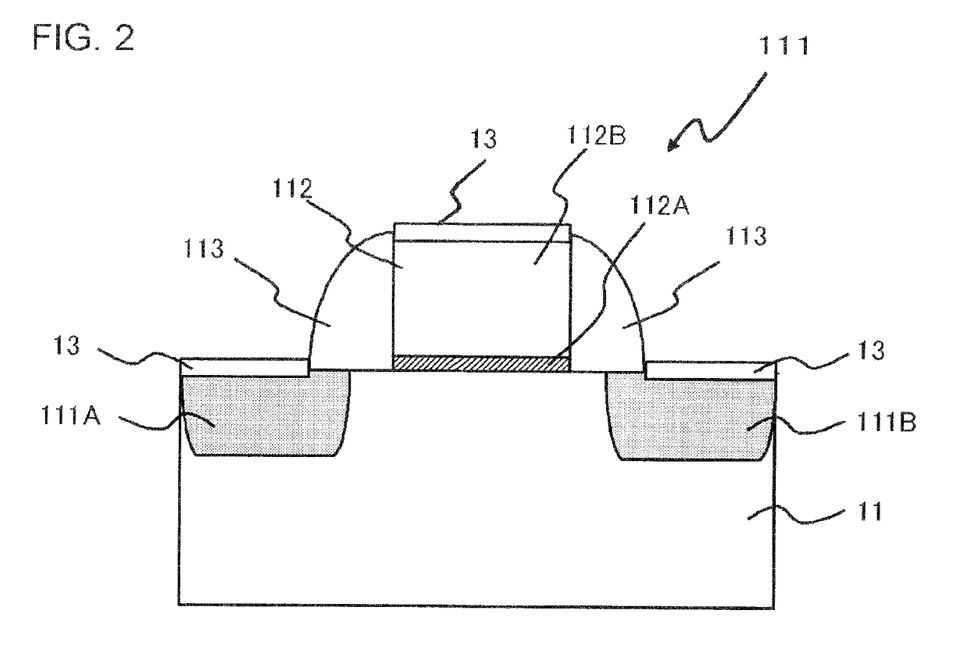
FIG. 2 is a cross sectional diagram showing a semiconductor device.

After that, heat treatment is carried out on the substrate 11 at a predetermined temperature as the second sintering, and as shown in FIG. 2, a silicide film 13 is formed. The temperature for heat treatment in the second sintering only has to be equal to or higher than the maximum temperature for the first sintering, which is approximately 400° C. to 600° C. when the metal film is made of Ni.

The semiconductor device with a silicide film (nickel silicide film in the present embodiment) 13 can be obtained as described above.

Next, the working effects of the present embodiment are described.

In the present embodiment, the relationship between the warping of the substrate 11 and the temperature for heat treatment when the silicide film 13 is formed on the substrate 11 is acquired in advance, and the warping of the substrate 11 is measured during the heat treatment.

The warping of the substrate 11 at the temperature for heat treatment carried out on the substrate 11 is found from the relationship from the warping of the substrate 11 and the temperature for heat treatment, and the difference between the found warping of the substrate 11 and the measured warping of the substrate 11 is found.

When the difference exceeds a predetermined value, it can be known that the reaction of conversion to silicide has progressed excessively, or the progress of the reaction of conversion to silicide is too slow. Therefore, the conditions for heat treatment are adjusted so that the progress of the reaction of conversion to silicide is adjusted, and thus the silicide film 13 with a desired film quality can be obtained. When the progress of the reaction of conversion to silicide is too slow, for example, the rate of temperature rise for heat treatment is increased, so that the progress of the reaction of conversion to silicide is accelerated to a desired degree, and thus the silicide film 13 with a desired film quality can be obtained.

On the other hand, when the reaction of conversion to silicide has progressed excessively, the rate of temperature rise for heat treatment is lowered, so that the progress of the reaction of conversion to silicide can be adjusted.

In addition, in the present embodiment, when the difference between the found warping of the substrate 11 and the measured warping of the substrate 11 exceed the predetermined value, heat treatment is stopped and the substrate 11 is discarded. By doing so, a semiconductor device having the silicide film 13 not having the desired film quality can be prevented from being manufactured.

Furthermore, conversion to silicide progresses significantly in the first heating step (first sintering) and therefore the resistance of the silicide film and the leak of the current are affected. In this step, the progress of the reaction of conversion to silicide is understood precisely and controlled, and thus a semiconductor device having desired performance can be manufactured.

In addition, Japanese Laid-open patent publication NO. 2005-20032 discloses a method using X-ray diffraction in order to detect the progress of the reaction of conversion to silicide.

In the X-ray diffraction method, however, measurement is difficult unless the silicide film has a certain thickness, and measurement may be impossible when the silicide film is thin.

In contrast, in the present embodiment, the warping of the substrate 11 is detected by means of laser beams, so that the progress of the reaction of conversion to silicide can be understood. In this method, the progress of the reaction of conversion to silicide can be understood surely, even when the silicide film 13 is thin.

Second Embodiment

In the above-described embodiment, the warping of the substrate 11 is measured, and the warping of the substrate 11 at the temperature for heat treatment is found from the relationship between the warping of the substrate 11 and the temperature for heat treatment and the temperature for heat treatment of the substrate 11 when the warping of the substrate 11 is measured. In addition, the difference between the found warping of the substrate 11 and the measured warping of the substrate 11 is found, and whether the difference is a predetermined value or greater is determined.

In contrast, in the present embodiment, the warping of the substrate 11 is measured, and after that, an expected value for the temperature of the substrate 11 when the warping of the substrate 11 is measured is found from the relationship between the warping of the substrate 11 and the temperature for heat treatment and the measured value of the warping of the substrate 11.

In addition, the difference between the expected value and the temperature for heat treatment carried out on the substrate 11 is found, and whether the difference is a predetermined value or greater is determined.

Figure 6:
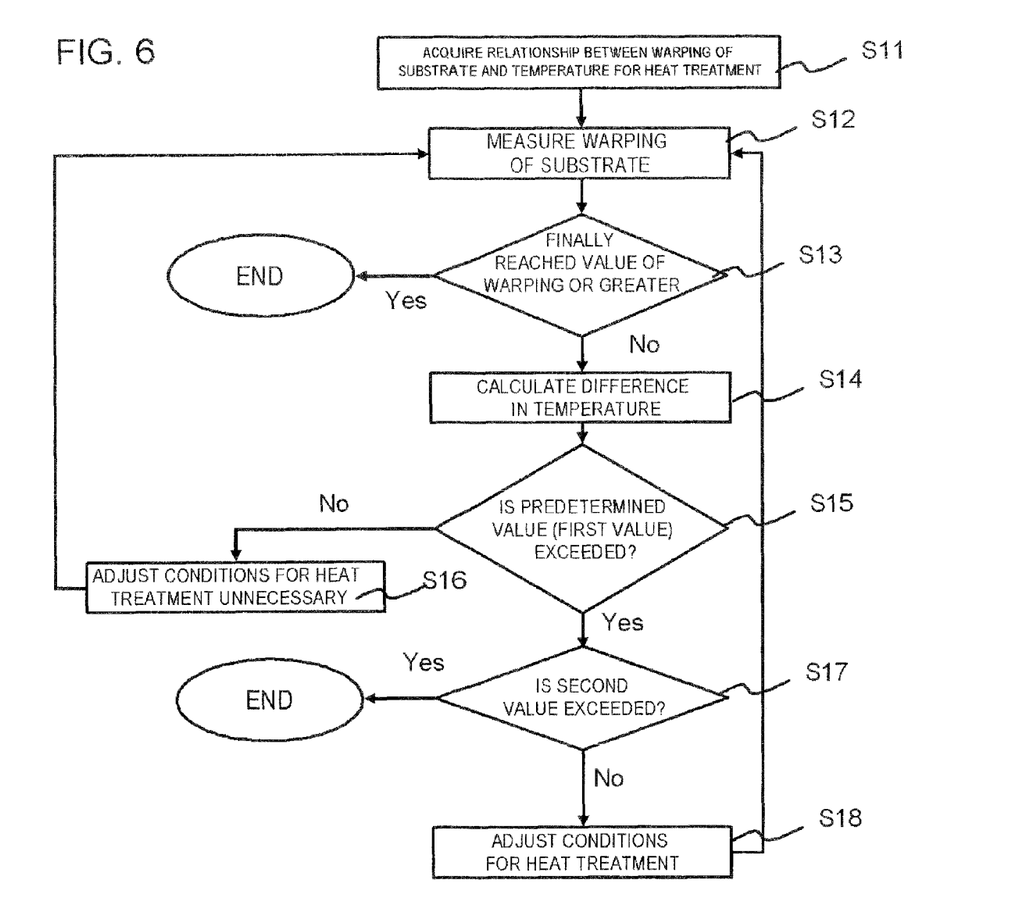
FIG. 6 is a flow chart showing the process for manufacturing a semiconductor device according to a second embodiment of the present invention.

The manufacturing method according to the present embodiment is outlined below in reference to FIG. 6.

The method includes acquiring the relationship between the warping of a substrate 11 having a layer including silicon on a surface and the temperature for heat treatment when the silicide film 13 is formed on the substrate 11 by forming a metal film 12 on the substrate 11 and carrying out heat treatment (first step; process S11); and forming the metal film 12 on the substrate 11 having the layer including silicon on the surface; forming the silicide film 13 through heat treatment where the temperature of the substrate 11 on which the metal film 12 is formed is increased so that the metal film 12 and the silicon on the surface of the substrate 11 react (second step).

The forming the silicide film 13 includes: measuring the warping of the substrate 11 during heat treatment (process S12); finding an expected value of the temperature of the substrate 11 corresponding to the measured warping of the substrate 11 from the relationship between the warping of the substrate 11 and the temperature for heat treatment; finding the difference between the expected value for the temperature of the substrate 11 and the temperature for heat treatment carried out on the substrate 11 when the warping of the substrate 11 is measured (process S14); determining whether the difference exceeds a predetermined value; stopping the heat treatment when the difference exceeds the predetermined value, or comparing the temperature for heat treatment carried out on the substrate 11 when the warping of the substrate 11 is measured and the expected value of the temperature of the substrate so that it is determined which of these temperatures is higher or lower; adjusting the conditions for heat treatment carried out on the substrate 11 during heat treatment based on the results of the determination and the difference; and not adjusting the conditions for heat treatment carried out on the substrate during heat treatment when the difference is a predetermined value or less.

Next, the manufacturing method according to the present embodiment is described in detail.

Processes S11 to S13, which are the same as processes S1 to S3 in the embodiment, are carried out. The process S1 is the same as the process S11, the process S2 is the same as the process S12, and the process S3 is the same as the process S13.

Next, when the measured value of the warping of the substrate 11 is less than the finally reached value of the warping, the expected value for the temperature of the substrate corresponding to the measured warping of the substrate 11 is found from, the relationship between the warping of the substrate 11 and the temperature for heat treatment.

In addition, the difference between the expected value for the temperature of the substrate 11 and the temperature for heat treatment carried out on the substrate 11 when the warping of the substrate 11 is measured (here, the set temperature for the heat treatment unit 3) is found (process S14)

When the calculated difference in temperature is a predetermined value (first value; for example 10° C.) or less, the reaction of conversion to silicide has progressed as in FIG. 4, and therefore the conditions for heat treatment carried out on the substrate 11 are not adjusted during heat treatment (process S16).

When the calculated difference in temperature exceeds the predetermined value (first value), whether the calculated difference in temperature is a second value which is higher than the first value (for example 25° C.), or higher, is determined (process S17). When the difference in the warping exceeds the second value, it is determined that the substrate 11 is abnormal, and the heat treatment is stopped.

When the calculated difference in temperature is the second value or less, the reaction of conversion to silicide has progressed excessively or too slow, and therefore the conditions for heat treatment carried out on the substrate 11 are adjusted during heat treatment (process S18)

Concretely, the conditions for heat treatment are adjusted as follows.

First, the expected value for the temperature of the substrate 11 corresponding to the measured warping of the substrate 11 is found based on the relationship between the warping of the substrate 11 and the temperature for heat treatment (FIG. 4).

Thus, when the expected value for the temperature of the substrate 11 is high compared with the temperature for heat treatment carried out on the substrate 11, it can be known that the reaction of conversion to silicide has progressed excessively. Therefore, the rate of temperature rise for heat treatment is lowered, so that the progress of the reaction of conversion to silicide can be made closer to the desired progress (in other words, the progress of the reaction of conversion to silicide when FIG. 4 is prepared). An appropriate amount of the rate at which the temperature rise lowers can be set based on the difference.

On the other hand, when the expected value for the temperature of the substrate 11 is low compared with the temperature for heat treatment carried out on the substrate 11, it can be known that the reaction of conversion to silicide is too slow. In this case, the rate of temperature rise of the substrate 11 may be lower than the rate of temperature rise set as in FIG. 4, and thus the rate of temperature rise for heat treatment is increased, so that the progress of the reaction of conversion to silicide can be made closer to the desired progress (in other words, the progress of the reaction of conversion to silicide when FIG. 4 is prepared) An appropriate amount of the rate at which the temperature rise increases can be set based on the difference.

Here, when the temperature of the heat treatment unit 3 is at 300° C. when the warping of the substrate 11 is measured, the measured value is less than the finally reached value of warping, and the difference in the warping of the substrate exceeds the first value, and is the second value or less, the temperature of the heat treatment unit 3 is fixed at 300° C. in the step of adjusting the conditions for heat treatment (process S18), so that heat treatment is carried out at a constant temperature until the measured value of the substrate 11 reaches the finally reached value of warping.

As a result, the actual warping of the substrate 11 can be made the same as the finally reached value of warping.

In addition, it is not necessary for the first value, which is the difference in temperature and used as a reference for adjusting the conditions for treatment, and the second value used as a reference for stopping heat treatment to be the same during the entire process for heat treatment, and the two may vary. The first value and the second value may be different between the initial stage for heat treatment and around the completion of heat treatment, for example.

Furthermore, it is preferable for the sequence of steps in the processes S12 to S18 to be carried out a plurality of times in the first sinter.

In particular, when the temperature of the heat treatment unit 3 is at a temperature about the inflexion point in the graph in FIG. 4, it is desirable for the warping of the substrate 11 to be measured at different temperatures for heat treatment, and carry out the processes S12 to S18. It is preferable to measure the warping of the substrate 11 every time the temperature of the heat treatment unit 3 is at the temperature at the inflexion point in the curve in FIG. 4, as well as at a point 25° C. higher and lower than the inflexion point, for example. By doing so, the tendency of the warping of the substrate 11 (progress in reaction of conversion to silicide) can be understood precisely.

The steps can be carried out in the same heat treatment unit 3 as in the first embodiment, and the temperature for heat treatment when the warping is measured is acquired in the second determining unit 341B in this embodiment. In addition, the expected value for the temperature of the substrate 11 corresponding to the measured value of the warping is found based on the relationship between the temperature for heat treatment stored in the memory unit 343 and the warping. After that, the difference between the expected value for the temperature of the substrate 11 and the temperature for heat treatment when the warping is measured is calculated, and the process S14 is carried out.

After that, the process S15 is carried out in the second determining unit 341B, and when it is determined that the difference exceeds the first value, the process S17 is carried out. On the other hand, when it is determined that the difference is the first value or less, no particular process is carried out (process S16).

The process S17 is carried out in the second determining unit 341B, and when it is determined that the difference exceeds the second value, a signal for stopping the operation is sent to the lamp 31 from the control unit 342.

On the other hand, when it is determined that the difference is the second value or less, the third determining unit 341C determines which is higher or lower, the expected value for the temperature of the substrate 11, or the temperature for heat treatment carried out on the substrate.

The control unit 342 controls the operation of the lamp 31 based on the determination in the third determining unit 341C as to which temperature is higher or lower, and the difference in temperature calculated by the second determining unit 341B. Concretely, the rate of temperature rise for heat treatment is adjusted as described above, or the temperature for heat treatment is fixed at a predetermined value, and the lamp 31 is operated until the measured value of the warping becomes a predetermined value.

After the first sintering step is carried out as described above, the part of the metal film 12 that is unreacted is removed through wet etching, as in the first embodiment.

After that, heat treatment is carried out on the substrate 11 at a predetermined temperature in the second sintering, as in the first embodiment, so that the silicide film 13 is formed. The temperature for heat treatment in the second sintering only has to be equal to or higher than the highest temperature in the first sintering, and approximately 400° C. to 600° C. when the metal film is made of Ni.

In the present embodiment, the same effects can be obtained as in the first embodiment.

The relationship between the warping of the substrate 11 and the temperature for heat treatment when a silicide film 13 is formed on the substrate 11 is acquired in advance, and the warping of the substrate 11 is measured during heat treatment.

In addition, the expected value for the temperature of the substrate 11 is found from the relationship between the warping of the substrate 11 and the temperature for heat treatment and the measured warping of the substrate 11, and thus the difference between the expected value for the temperature of the substrate 11 and the temperature for heat treatment carried out on the substrate 11 when the warping of the substrate 11 is measured is found.

When the difference is a predetermined value or greater, it can be known that the reaction of conversion to silicide has progressed excessively, or the progress of the reaction of conversion to silicide is too slow. Therefore, the conditions for heat treatment are adjusted, and thus the progress of the reaction of conversion to silicide are adjusted so that the silicide film 13 with the desired film quality can be obtained. Concretely, when the reaction of conversion to silicide progresses too slow, the rate of temperature rise for heat treatment is increased, so that the progress of the reaction of conversion to silicide can be adjusted. In addition, when the progress of the reaction of conversion to silicide is too slow, the temperature for heat treatment is fixed for heat treatment, so that the warping of the substrate 11 reaches the found value, and thus the progress of the reaction of conversion to silicide can be adjusted.

In addition, when the progress of the reaction of conversion to silicide has progressed excessively, the rate of temperature rise for heat treatment is lowered, so that the progress of the reaction of conversion to silicide can be adjusted.

Furthermore, when the difference is a predetermined value or greater, the heat treatment is stopped and the substrate 11 is discarded. By doing so, a semiconductor device having a silicide film not having the desired film quality can be prevented from being manufactured.

Here, the present invention is not limited to the embodiments, and modifications and improvements within such a scope that the object of the present invention can be achieved are included in the present invention.

Furthermore, in the embodiments, the progress of the reaction of conversion to silicide is adjusted in the first sintering (processes S1 to S8, processes S11 to S18), and the same processes may be carried out again in the second sintering.

In addition, the processes S1 to S8 and the processes S11 to S18 may be carried out only in the second sintering.

Furthermore, in order to form the desired silicide film surely, the heat treatment may be stopped and the substrate maybe discarded instead of adjusting the conditions for heat treatment, when it is determined that the difference exceeds a predetermined value in the process S5 or S15. By discarding substrates with which the progress of the reaction of conversion to silicide deviates by a predetermined amount or more, only semiconductor devices having a silicide film with the desired film quality can be manufactured surely.

In addition, though in the above embodiments, an Si substrate is used as the substrate 11, the invention is not limited to this, and an SOI substrate with a silicon layer formed at the surface may be used, for example.

In addition, though in the embodiments, the substrate for which the relationship between the warping of the substrate and the temperature for heat treatment is measured as shown in FIG. 4, and the actual substrate where silicide is formed in accordance with the present manufacturing method are the same in terms of the type of impurities and the amount of impurities injected, the invention is not limited to this, and the substrate for which the relationship between the warping of the substrate and the temperature for heat treatment is measured and the actual substrate where silicide is formed may be different in terms of the type of impurities or the amount of impurities injected, for example.

Even in this case, the substrate tends to warp when silicide is formed, as shown in FIG. 4, and therefore it becomes possible to obtain a desired silicide film by adjusting the conditions for heat treatment based on the warping of the substrate.

In addition, though in the embodiments, heat treatment is carried out on the substrate 41 and the metal film 12 using the lamp 31, the invention is not limited to this, and heat treatment may be carried out on the substrate 11 and the metal film 12 using a hot plate, for example.

EXAMPLES

Next, examples of the present invention are described.

As in the embodiments, the relationship between the temperature for heat treatment and the stress on the substrate when a silicide film is formed on a substrate was measured. The results are shown in FIG. 4. A silicon substrate on which a MOS transistor is formed as in the embodiments was used, and an Ni film was used as the metal film. The rate of temperature rise was 25° C./min.

In addition, the heat treatment unit shown in FIG. 5 was used.

Next, a metal film (Ni film) was formed on the substrate, heat treatment was carried out on the substrate in the heat treatment unit in FIG. 5, and thus the metal film is converted to silicide. The rate of temperature rise was 25° C./min.

Here, the warping of the substrate was measured when the temperature of the heat treatment unit was at 100° C. The measured value of the warping of the substrate was −700 MPa. On the other hand, it was found from FIG. 4 that the warping of the substrate at 100° C. was −950 MPa.

The expected value for the temperature of the substrate for −700 MPa was approximately 120° C.

The difference between the measured value and the warping of the substrate as found from FIG. 4 was 250 MPa, and it was known that the reaction of conversion to silicide had progressed excessively (it is not necessary to adjust the conditions for heat treatment when the difference between the measured value and the warping of the substrate as found from FIG. 4 is 200 MPa or less).

Thus, the rate of temperature rise was 22° C./min.

Next, the warping of the substrate was measured when the heat treatment unit was at 150° C., 170° C. and 180° C.

The measured value of the warping of the substrate was −450 MPa, −200 MPa and 0 MPa, respectively.

In contrast, it can be known from FIG. 4 that the values of the warping of the substrate at 150° C., 170° C. and 180° C. were −250 MPa, 0 MPa and −200 MPa.

In addition, the expected value for the temperature of the substrate for the measured value of the warping of the substrate and FIG. 4 was approximately 135° C., 155° C. and 170° C.

The difference between the measured value and the warping of the substrate as found from FIG. 4 was 200 MPa, and it was found that the reaction of conversion to silicide was too slow here (it is unnecessary to adjust the conditions for heat treatment when the difference between the measured value of the warping and the warping of the substrate as found from FIG. 4 is 100 MPa or less).

Thus, the rate of temperature rise was 28° C./min.

Next, the warping of the substrate was measured when the heat treatment unit was at 300° C.

The measured value of the warping of the substrate was 450 MPa.

It is unnecessary to adjust the conditions for heat treatment when the difference between the measured value of the warping and the warping of the substrate as found from FIG. 4 is 10 MPa or less.

The temperature was kept the same (the temperature of the heat treatment unit was at 30° C.) without raising the temperature in the heat treatment unit, and heating was continued until the measured value of the warping of the substrate became 500 MPa.

When the measured value of the warping of the substrate became 500 MPa as a result of the above, the heat treatment was stopped.

The silicide film formed on the substrate as in the above had the desired film quality.

It is apparent that the present invention is not limited to the above embodiment, and may be modified and changed without departing from the scope and spirit of the invention.

What is claimed is:

1. A method of manufacturing a semiconductor device, the method comprising:
  acquiring in advance the relationship between the warping of a substrate having a layer including silicon at a surface and the temperature for heat treatment when the silicide film is formed on said substrate by forming a metal film on said substrate and carrying out heat treatment; and
  forming a silicide film on a substrate having a layer including silicon at a surface, wherein
  said forming a silicide film comprises:
  forming a metal film on said substrate; and
  forming said silicide film through heat treatment during which the temperature of said substrate on which said metal film is formed is raised so that said metal film and the silicon at the surface of said substrate react, and
  said forming a silicide film comprises:
  measuring the warping of said substrate during heat treatment;
  finding the warping of said substrate corresponding to the temperature for heat treatment carried out on said substrate when the warping of said substrate is measured from said relationship between the warping of the substrate and the temperature for heat treatment;
  calculating the difference between said found warping of the substrate and said measured warping of the substrate;
  determining whether said difference exceeds a predetermined value; and
  stopping said heat treatment when said difference exceeds the predetermined value, or finding an expected value of the temperature of said substrate corresponding to said measured warping of the substrate from said relationship between the warping of the substrate and the temperature for heat treatment;

comparing the temperature for heat treatment carried out on said substrate when the warping of said substrate is measured and the expected value of the temperature of said substrate so that it is determined which of these temperatures is higher or lower; and adjusting the conditions for heat treatment carried out on said substrate during heat treatment based on the results of the determination and said difference; and not adjusting the conditions for heat treatment carried out on said substrate during heat treatment when said difference is a predetermined value or less.

2. The method of manufacturing a semiconductor device according to claim 1, wherein in said adjusting said conditions for heat treatment, the rate of temperature rise for heat treatment is lowered when the expected value of the temperature of said substrate is high compared with the temperature for heat treatment carried out on said substrate, and the rate of temperature rise for heat treatment is increased or the temperature for heat treatment is fixed at a constant temperature, and thus said substrate is heated so that the found value of warping of said substrate is reached when the expected value of the temperature of said substrate is low compared with the temperature for heat treatment carried out on said substrate.

3. The method of manufacturing a semiconductor device according to claim 1, wherein said forming a silicide film is a first heating process, and the method further comprises:

after said first heating process, removing part of the metal film which is unreacted with silicon, and secondly heating said substrate at a temperature not lower than the highest temperature for heat treatment in said first heating process after the removal of part of said metal film that is unreacted.

4. The method of manufacturing a semiconductor device according to claim 1, wherein the warping of said substrate increases by carrying out heat treatment in said forming a silicide film, the method further comprising:

finding the finally reached value of warping in said forming a silicide film;

detecting whether the warping measured in said measuring the warping of said substrate during heat treatment has said finally reached value of warping after said measuring of the warping of the substrate;

stopping heat treatment when said measured warping has a value not lower than said finally reached value of warping;

when said measured warping has a value less than said finally reached value of warping, said finding the warping of said substrate corresponding to the temperature for heat treatment carried out on said substrate from said relationship between the warping of the substrate and the temperature for heat treatment when the warping of said substrate is measured.

5. The method of manufacturing a semiconductor device according to claim 1, wherein in said measuring the warping of said substrate during heat treatment, a plurality of portions on said substrate are irradiated with a laser beam from a laser source, and the reflected light is detected so that the distance between said laser source and said substrate is detected and the warping of said substrate is measured.

6. The method of manufacturing a semiconductor device according to claim 1, wherein said metal film is a film containing nickel, and
said silicide film is a nickel silicide film.

* * * * *